(12) United States Patent
Tilbrook et al.

(10) Patent No.: US 7,482,804 B2
(45) Date of Patent: Jan. 27, 2009

(54) SUPERCONDUCTING QUANTUM INTERFERENCE DEVICE

(75) Inventors: David Louis Tilbrook, Glenorie (AU); Keith Leslie, North Epping (AU)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 243 days.

(21) Appl. No.: 10/523,960

(22) PCT Filed: Aug. 7, 2003

(86) PCT No.: PCT/AU03/00997

§ 371 (c)(1), (2), (4) Date: Nov. 14, 2005

(87) PCT Pub. No.: WO2004/015788

PCT Pub. Date: Feb. 19, 2004

(65) Prior Publication Data

US 2006/0113992 A1    Jun. 1, 2006

(30) Foreign Application Priority Data

Aug. 7, 2002    (AU)    ............................... 2002950624

(51) Int. Cl.
  *G01R 33/035*    (2006.01)
(52) U.S. Cl. ...................... 324/248; 505/846
(58) Field of Classification Search ................ 324/248; 505/162, 845–846; 600/409; 326/5
See application file for complete search history.

(56) References Cited

U.S. PATENT DOCUMENTS

| 4,693,000 A | 9/1987 | Hoenig |
| 4,982,157 A | 1/1991 | Seifert |
| 5,442,289 A | 8/1995 | DiIorio et al. |
| 5,469,058 A | 11/1995 | Dunnam |

FOREIGN PATENT DOCUMENTS

| DE | 199 48 618 A1 | 5/2001 |
| EP | 0 583 640 A1 | 2/1994 |
| JP | 04125981 | 4/1992 |
| JP | 05180917 A * | 7/1993 |
| WO | WO 00/57200 | 9/2000 |

OTHER PUBLICATIONS

International Search Report for PCT/AU03/000997.
Bar et al., Squid Eddy Current Technique Applying Conformable Eddy Current Probes, European Conference on Non-Destructive Testing Proceedings 1998, Dec. 1998, vol. 3, No. 12.
S. Kumar et al., "Nuclear magnetic resonance using a high temperature superconducting quantum interference device," Feb. 24, 1997 pp. 1037-1039, J. Appl. Phys. Lett. vol. 70 No. 8, 1997 American Institute of Physics.

(Continued)

*Primary Examiner*—Bot LeDynh
(74) *Attorney, Agent, or Firm*—Kenyon & Kenyon LLP (57) ABSTRACT

A superconducting magnetic field detection element (10) comprising at least one superconducting pick-up loop (12) formed on a common flexible substrate (11), wherein the common flexible substrate (11) is in a non-planar position, such that the at least one superconducting pick-up loop (12) is operable to detect magnetic fields of differing orientation.

25 Claims, 7 Drawing Sheets

OTHER PUBLICATIONS

K. Chen et al., "High-$T_c$ SQUID magnetometer and planar gradiometer and their applications in non-destructive evaluation," Physica C 341-348 (2000) 2709-2710.

F.P. Miliken et al., "The response of high-$T_c$ SQUID magnetometers to small changes in temperature," Dec. 15, 1997, pp. 6301-6305, J. Appl. Phys. vol. 80 No. 12, 1997 American Institute of Physics.

Y. Zhang et al., "A design of planar multi-turn flux transformers for radio frequency SQUID magnetometers," Apr. 20, 1998, pp. 2029-2031, Applied Physics Letters vol. 72 No. 16, 1998 American Institute of Physics.

A.D. Hibbs et al., "A high-resolution magnetic imaging system based on a SQUID magnetometer," Jul. 1992, pp. 3652-3658, Rev. Sci. Instrum. vol. 63 No. 7, 1992 American Institute of Physics.

J. Clarke, "SQUIDs (for superconducting quantum interference devices) are the most sensitive detectors of magnetic fields. Their applications range from diagnosis of brain tumors to tests of relativity," Aug. 1994, pp. 36-43, Scientific American Aug. 1994.

H.E. Hoenig et al., "Multichannel DC SQUID Sensor Array for Biomagnetic Applications," Mar. 1991, pp. 2777-2785, IEEE Transactions on Magnetics, vol. 27, No. 2, Mar. 1991.

Y.A. Tavrin et al., "Two-hole bulk high $T_c$ SQUID electronic gradiometer for magnetocardiography in unshielded space," Jul. 1993, pp. 719-723, Cryogenics 1993 vol. 33, No. 7.

K. Enpuku et al., "Progress in High $T_c$ Superconducting Quantum Interference Device 9SQUID) Magnetometer," Jan. 2000, pp. 34-43, IEICE Trans. Electron., vol. E83-C, No. 1, Jan. 2000.

S. Knappe et al., "A planar $YBa_2Cu_3O_7$ gradiometer at 77 K," Apr. 13, 1992, pp. 881-884, Cryogenics 1992 vol. 32, No. 10.

G.M. Daalmans, "HTS DC SQUIDS for Practical Applications," 1995, pp. 399-423, Applied Superconductivity vol. 3, No. 7-10, 1995, Great Britain.

* cited by examiner

FIGURE 7

SUPERCONDUCTING QUANTUM INTERFERENCE DEVICE

CROSS-REFERENCE TO RELATED APPLICATIONS

This application is a 35 U.S.C. 371 national stage of International Application No. PCT/AU2003/000997 filed Aug. 7, 2003, which claims priority to Australian Application No. 2002950624 filed Aug. 7, 2002.

TECHNICAL FIELD

The present invention relates to superconducting devices having elements positioned in three dimensions, and in particular to high temperature superconducting devices having elements positioned in three dimensions. The invention particularly relates to high temperature superconducting axial gradiometers, which employ a gradiometric pick-up loop formed by etching a transformer loop structure on a flexible superconducting tape. The pick-up loop is preferably inductively coupled to a superconducting quantum interference device (SQUID) magnetometer. In applications where the sensitivity to the magnetic field in the direction transverse to the gradiometer axis is problematic, the homogeneous background magnetic field can be reduced by matching the mutual inductance between the secondary loop of the flux transformer and the magnetometer to establish a condition of shielding.

BACKGROUND ART

Superconducting Quantum Interference Devices (SQUIDs) are often used as highly sensitive magnetic field sensors. Such SQUID sensors are becoming increasingly popular due to the capabilities of high sensitivity sensing in areas such as geophysical mineral prospecting and biological magnetic field detection, such as magnetic field emanations from the human brain or other human organs.

With the advent of high critical temperature superconducting (HTS) materials such as $YBa_2Cu_3O_x$ (YBCO), HTS-SQUIDs can operate at or above 77K (−196° C.) and hence can be cooled by relatively inexpensive liquid nitrogen, rather than requiring liquid helium as a coolant for operation at 4K (−269° C.). Liquid nitrogen is also more convenient to use than liquid helium, allowing the system as a whole to be made in a compact form.

The use of high-temperature superconducting (HTS) materials for the fabrication of SQUID based magnetometers and gradiometers is now fairly well established (For example, W. Eldelloth, B. Oh, R P. Robertazzi. W. J. Gallagher, R. H. Koch, Appl. Phys. Lett., 59, 3473 (1991); S. Knappe, D. Drung, T. Schurig, H. Koch, M. Klinger, J. Hinker, Cryogenics. 32, 881, (1992); M. N. Keene, S. W. Goodyear, N. G. Chew, R. G. Humphreys, J. S. Satchell, J. A. Edwards, K. Lander, Appl. Phys. Lett. 64, 366 (1994); G. M. Daalmans, Appl. Supercond. 3, 399, (1995); M. I. Faley, U. Poppe, K. Urban, H.-J. Krause, H. Soltner, R. Hohmann, D. Lomparski, R. Kutzner, R. Wordenweber, H. Bousack, A. I. Braginski, V. Y. Slobodchikov, A. V. Gapelyuk, V. V. Khanin, Y. V. Maslennikov, IEEE Trans. Appl. Supercond., 7, 3702 (1997)). Despite the significant advantages which accrue from being able to operate at liquid nitrogen temperatures, HTS materials remain more difficult to use than the alternative low-temperature superconducting materials, and many design practices in low temperature helium cooled superconductors (LTS) cannot be implemented in HTS materials. In particular, the lack of HTS superconducting wires and the difficulty of forming superconducting connections in HTS materials means that the standard LTS design practice of forming gradiometer coils from superconducting wires, is not applicable in HTS materials.

Designs for HTS gradiometers sensitive to the on-diagonal components, $\partial B_i/\partial X_i$ (axial gradiometers), have been described (for example: R. H. Koch, J. R. Rozen, J. Z. Sun, W. J. Gallagher, Appl. Phys. Left., 63, 403,(1993); H. J. M. ter Brake, N. Janssen, J. Flokstra, D. Veldehuis, H. Rogalla, IEEE Trans. Appl. Supercond., 7, 2545, (1997); J. Borgmann, P. David, G. Ockenfuss, R. Otto, J. Schubert, W. Zander, A. J. Braginski, Rev. Sci. instrum. 68, 2730,(1997) but these have been implemented only by means of electronic or software subtraction of the outputs of a pair of SQUID magnetometers which are generally positioned at fixed distances from each other on a common normal axis. These designs suffer from the disadvantage that both magnetometers must operate linearly in the full ambient field (often the earth's magnetic field). It is difficult to achieve good common-mode rejection (rejection of homogeneous fields) which is generally limited to an order of about $10^{-3}$ in most implementations, Furthermore, the achievable noise performance can be dependent upon the magnitude of the background homogeneous field; being determined by microphonics which arise from vibrations causing randomly varying misalignment of the axes of symmetry of the two SQUIDs.

Some of these problems are ameliorated by the use of intrinsic gradiometer structures. Although several designs for intrinsic magnetic gradiometers utilising HTS films have been described in the literature these designs are sensitive only to the off-diagonal components of the first-order gradient tensor, $\partial B_i/\partial X_j$, $i \neq j$ (transverse gradiometers). These designs generally fall into one of two types. The first employs a "figure eight" topology in which the gradiometric pick-up loop structure consists of a pair of superconducting loops with a common conductor that is interrupted by a direct current (DC) SQUID. The SQUID operates as a two-port device (SQUID amplifier) because the flux in the SQUID is derived from the current directly injected into a pair of input terminals. Depending upon the matching of the inductances and equivalent magnetic areas of the gradiometer input loops the current in the SQUID is proportional to the difference in the shielding currents induced in the pick-up loops in response to an external magnetic field gradient. The two pick-up loops are electrically in parallel, so one disadvantage of this topology is that even in a homogeneous field a large overall shielding current is induced in the outer perimeter of the pick-up loop structure with the potential to degrade noise performance through the associated production of large numbers of Abrikosov vortices in the superconducting film.

Another approach to the development of HTS transverse gradiometers employs a planar pick-up loop structure that is flip-chipped with a SQUID magnetometer to which it is inductively coupled. In the first-order designs the flux transformer consists of a pair of pick-up loops, one of which is coupled to the SQUID magnetometer. By matching the mutual inductance between the SQUID and the loop, the total effective magnetic area of the SQUID/loop combination can be made exactly opposite to that of the other loop of the flux transformer. Under these conditions the sensitivity to a homogeneous magnetic field vanishes but remains non-zero with respect to a magnetic field gradient. A second-order transverse gradiometer has also been implemented using this approach.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

Throughout this specification, the terms 'superconducting material', 'superconducting device' and the like are used to refer to a material or device which, in a certain state and at a certain temperature, is capable of exhibiting superconductivity. The use of such terms does not imply that the material or device exhibits superconductivity in all states or at all temperatures.

SUMMARY OF THE INVENTION

According to a first aspect, the present invention provides a superconducting magnetic field detection element comprising at least one superconducting pick-up loop formed on a common flexible substrate, wherein the common flexible substrate is in a non-planar position, such that the at least one superconducting pick-up loop is operable to detect magnetic fields of differing orientation.

According to a second aspect, the present invention provides a method of forming an element of a superconducting device for detecting magnetic fields, the method comprising:

forming at least one superconducting pick-up loop on a common flexible substrate; and positioning the common flexible substrate in a non-planar configuration such that the at least one superconducting pick-up loop is operable to detect magnetic fields of differing orientation.

In some embodiments of the invention, the common flexible substrate may partially extend within a first plane and partially extend within a second plane substantially perpendicular to the first plane such that the at least one superconducting pick up loop is positioned in both the first plane and the second plane. Such embodiments of the invention may prove advantageous when a magnetic dipole of unknown random orientation is placed at a position where a normal to the first plane meets a normal to the second plane. The positioning of the at least one pick-up loop in two perpendicular planes increases the likelihood that a magnetic field of the magnetic dipole will pass through at least some portion of the pick-up loop, and will thus induce a current in the pick-up loop, enabling detection of the magnetic dipole.

Alternatively, the common flexible substrate may be positioned such that the at least one superconducting pick-up loop describes an arc, for example an arc which subtends an angle of 90° about a nominal focus. In such embodiments, positioning a randomly oriented magnetic dipole at or near the nominal focus of the arc of the pick-up loop will provide a higher likelihood of detecting the magnetic dipole than would exist in cases where the pick up loop is positioned within a single plane. Such embodiments of the present invention may have particular application in the screening of substances or articles for detection of randomly oriented embedded magnetic objects.

In further embodiments of the present invention, a plurality of superconducting pick up loops may be formed on the common flexible substrate. In such embodiments the common flexible substrate may be arranged so as to position each of the plurality of pick up loops in a unique plane which is not coplanar with any plane in which another pick up loop is positioned. For example, two superconducting pick up loops may be provided, and may be positioned in respective first and second planes, the first and second planes being substantially perpendicular to each other. Alternatively, two superconducting pick up loops may be provided and may be positioned in respective first and second planes, the respective first and second planes being parallel to each other and spaced apart.

Further, in embodiments of the invention in which a device is provided having two superconducting pick-up loops formed on the common flexible substrate, the inherent characteristics of the two superconducting pick-up loops, such as critical current and effective area, are likely to be significantly closer to being matched than would be the case for the characteristics of pick-up loops or devices formed on separate substrates. Thus, the error margin of such devices can be expected to be significantly smaller, and indeed, magnetic fields of up to $10^8$ lower than the earth's magnetic field may be detected by some embodiments of the present invention. Additionally, embodiments of the present invention which provide two superconducting pick-up loops on the common flexible substrate enable construction of magnetic field detection devices such as axial gradiometers which comprise only a single SQUID. Such circuits offer significant advantages over circuits requiring the extra complexity of providing a plurality of SQUIDs, in terms of both physical device manufacture and the device electrical characteristics.

Superconducting tape has been developed primarily for power transmission applications. In early developments such tape was formed using powder in silver tube filled with one of the various ceramic HTS materials but more recently developments in tape technology have led to the ability to form YBCO films on both metal and insulating substrates with an intervening buffer layer.

In preferred embodiments of the present invention, the common flexible substrate may comprise Hastelloy tape, preferably of 50 to 200 μm thickness. In addition to providing a common flexible substrate in accordance with the present invention, Hastelloy tape is also advantageous in that a pick-up loop of significantly larger area may be formed at significantly less cost, when compared to non-flexible crystalline substrates such as MgO, $SrTiO_3$, $LaAl_2O_3$ or the like. In alternate embodiments of the present invention, the common flexible substrate may comprise a partially or fully stabilised zirconia substrate, for example in very thin flexible sheet form, such as is provided under the name Ceraflex by MarkeTech International of 4750 Magnolia St, Port Townsend, Wash., 98368, USA. Ceraflex has been found to possess improved noise properties over Hastelloy tape, enabling an SNR of a superconducting device formed over the Ceraflex substrate to be improved by perhaps 30% relative to Hastelloy tape.

In embodiments of the present invention in which the common flexible substrate is a polycrystalline substrate such as Hastelloy or Ceraflex, a biaxially aligned buffer layer such as yttria-stabilised zirconia (YSZ) is preferably formed over the common flexible substrate in order to improve biaxial alignment of a superconducting material from which the at least one superconducting pick up loop is formed. The buffer layer may be deposited by ion beam assisted deposition (IBAD), or by double ion beam assisted deposition (DIBAD), as set out in the present applicant's co-pending International Patent Application No. PCT/AU02/00696, the contents of which are incorporated herein by reference.

In embodiments of the present invention, a magnetic field passing through the at least one pick up loop which induces a current in the at least one pick up loop may be detected by use of a SQUID. The SQUID may be formed on the common flexible substrate. Alternatively the SQUID may be magnetically coupled to the at least one pick up loop by way of a flux transformer formed on the common flexible substrate, and by positioning the SQUID to allow coupling between the flux transformer and the SQUID. For example the SQUID may be mounted against the flux transformer in a "flip-chip" arrangement.

The present inventors have recognised that it is possible to use flexible substrates, such as Hastelloy tapes or Ceraflex, to support a biaxially aligned buffer layer and thus to support a flexible superconducting circuit, formed over the buffer layer. For instance, such substrates may be used to support flexible superconducting circuits such as large area pick-up loops for magnetometers. Thus, the present invention extends the applications of superconducting tape utilising such flexible substrates to include use as a flexible superconducting medium for the fabrication of flexible superconducting circuits including gradiometer pick-up loops and flexible ground-planes for superconducting strip-lines. Further such applications include the formation of flexible superconducting wave-guides. In many such applications envisaged by the present invention, even relatively short lengths of tape, of the order of a few hundred millimeters, would be sufficient.

Accordingly, in a third aspect, the present invention provides a flexible superconducting device comprising a flexible polycrystalline substrate, a biaxially aligned buffer layer, and at least one superconducting component formed over the biaxially aligned buffer layer.

Similarly, according to a fourth aspect the present invention provides a method of forming a flexible superconducting device, the method comprising:

providing a flexible polycrystalline substrate;

forming a biaxially aligned buffer layer over the flexible polycrystalline substrate; and forming at least one superconducting component over the biaxially aligned buffer layer.

In accordance with embodiments of the third and fourth aspects of the present invention, the flexible superconducting device may comprise one or more of the following non-limiting list of superconducting devices: a pick up loop; a ground plane; a strip-line connector, a waveguide; a flux transformer; a Josephson Junction; and, a SQUID.

A smallest radius of curvature of the common flexible substrate should be controlled. This is due to the possibility of an overly tight curvature of the device causing damage to the polycrystalline flexible substrate, the biaxially aligned buffer layer, the crystalline superconducting layer or any other layer such as an overlying silver passivating layer. Depending on the materials from which the common flexible substrate, the buffer layer, the superconducting pick up loops, and any other layers such as a passivation layer are formed, the minimum permissible radius of curvature of the device may vary.

The tape may also be twisted in order to provide circuit elements in a third plane, for example, to provide elements in three orthogonal planes. Once again, a minimum radius of curvature or twist is preferably controlled in order to avoid damage to the device.

According to a fifth aspect, the present invention provides a superconducting gradiometer comprising:

a first pick-up loop defining and substantially residing in a first nominal plane; and a second pick-up loop defining and substantially residing in a second nominal plane;

wherein the first pick-up loop and the second pick-up loop are formed on a common flexible substrate, wherein the first nominal plane and the second nominal plane are substantially parallel, and wherein the first nominal plane and the second nominal plane are sufficiently spaced apart to allow the first pick-up loop and the second pick-up loop to act to distinguish local magnetic fields from background magnetic fields.

By providing first and second pick-up loops which are formed on a common flexible substrate, the fifth aspect of the present invention allows a gradiometer to be constructed without the need for separately formed connections between the first pick-up loop and the second pick-up loop.

The use of a flexible substrate in accordance with the fifth aspect of the present invention allows formation of the superconducting gradiometer in a single plane, such as by planar deposition techniques. After the pick-up loops have been formed on the flexible substrate, deformation or bending of the flexible substrate allows the first and second pick-up loops to be respectively positioned in the first and second nominal planes.

Positioning the first and second pick-up loops in accordance with the fifth aspect of the invention enables construction of a superconducting axial gradiometer. In some embodiments of the fifth aspect of the present invention, such an axial gradiometer may be implemented through the use of a superconducting flux transformer pick-up loop structure patterned on the common flexible substrate, the flux transformer pick-up loop being inductively coupled to a SQUID magnetometer.

In such embodiments, the axial gradiometer includes a flux transformer that is formed by patterning an appropriate circuit using conventional resist techniques over the superconducting layer of the tape, which for instance may be a YBCO layer formed over a biaxially aligned buffer layer of the flexible substrate. In such embodiments, the flux transformer comprises two outer pick-up loops which are connected in series with a centrally located secondary loop via a pair of flexible strip-line conductors. A SQUID magnetometer is then "flip-chipped" over the secondary loop and separated from the secondary loop by means of insulating spacers. In such embodiments, two additional lengths of flexible superconducting tape are preferably used to cover the strip-line connectors between each outer pick up loop and the secondary loop. With respect to the strip-line connectors, the additional lengths of flexible superconducting tape form a ground-plane. These additional lengths of flexible superconducting tape are preferably configured so as to serve three purposes. Firstly, such additional lengths of superconducting tape may serve to reduce unwanted shielding currents which might otherwise be induced in the loop structure from the strip-line connectors, and secondly may serve to reduce the inductance of the strip-line connectors. The effect of the strip-line inductance on the performance of the gradiometer is considered in more detail below. Finally, the additional superconducting tape ground-planes may, if necessary, be used to facilitate balancing or matching of the equivalent areas of the primary pick-up loops, for instance by sliding the additional superconducting covering ground tapes so as to expose an appropriate area of strip-line to the external field in a manner which balances the equivalent areas of the two outer pick up loops.

In preferred embodiments of the present invention, the flexible substrate comprises a flexible tape made of a rolled metal alloy such as Hastelloy. Advantageously, a Ceraflex tape may alternatively be used. In the past, Ceraflex tapes have not been used for HTS applications, however it has been realised by the present inventors that Ceraflex tape provides improved noise performance over traditional tapes such as Hastelloy tape, improving the SNR of a superconducting device formed on the tape by perhaps 30% relative to Hastelloy tape.

A buffer layer may be positioned between the substrate and the pick-up loops, for example to promote biaxial crystal alignment in superconducting material from which the pick-up loops are formed, and/or to isolate the superconducting material from the substrate. The buffer layer may comprise a biaxially aligned yttria-stabilised zirconia (YSZ) layer. The superconducting material may be $YBa_2Cu_3O_7$ (abbreviated as YBCO) or $Bi_{1.6}Pb_{0.4}Sr_2Ca_2Cu_3O_{10}$ (abbreviated as BSCCO). A protective layer such as an Ag layer can be provided over the superconducting material from which the pick-up loops are formed.

In preferred embodiments of the fifth aspect of the invention, a flux transformer is provided between the first and second pick-up loops in order to couple detected flux into a SQUID proximal to the flux transformer. For example, a SQUID may be formed by conventional means on a separate substrate and "sandwich-mounted" against the flux transformer, in a "flip-chip" arrangement as described previously.

Alternatively, a SQUID may be formed on the flexible substrate itself, by formation of a Josephson Junction, for example over a step edge etched into the substrate.

According to a sixth aspect, the present invention provides a method of fabrication of a superconducting gradiometer comprising the steps of:

forming a first pick-up loop and a second pick-up loop on a flexible substrate positioned substantially in a single nominal plane; and subsequently deforming the flexible substrate to position the first pick up loop substantially in a first nominal plane and to position the second pick-up loop substantially in a second nominal plane, wherein the first nominal plane and the second nominal plane are substantially parallel and are spaced sufficiently apart to allow the first pick-up loop and the second pick-up loop to act to distinguish local magnetic fields from background magnetic fields.

The method of the sixth aspect of the invention may comprise the additional steps of:

forming a flux transformer on said flexible substrate; and
sandwich mounting a SQUID against the flux transformer.

It will be appreciated that the step of forming a flux transformer may be most conveniently carried out simultaneously with the step of forming said first and second pick-up loops.

Alternatively, the method of the sixth aspect of the invention may comprise the additional steps of:

forming a step edge on the flexible substrate; and
forming a SQUID on the flexible substrate, having a Josephson Junction formed over said step edge.

The method of the sixth aspect of the invention may comprise the additional steps of:

forming a buffer layer over the flexible substrate prior to formation of said pick-up loops; and/or forming a protective coating over the first and second pick-up loops.

The buffer layer may be biaxially aligned YSZ, and may serve to promote biaxial growth of superconducting material from which the pick-up loops are formed, and may serve to isolate the pick-up loops from the substrate. The protective coating may be a silver coating.

To date, HTS flexible tapes have mainly been considered for power transmission purposes. Thus, it is envisaged that a relatively thin superconducting layer of perhaps 50-500 nm may be used in the present invention, as opposed to thicker power-carrying superconducting layers.

BRIEF DESCRIPTION OF THE DRAWINGS

By way of example only, preferred embodiments of the invention will be described with reference to the accompanying drawings, in which.

DESCRIPTION OF THE INVENTION

Figure 1A:
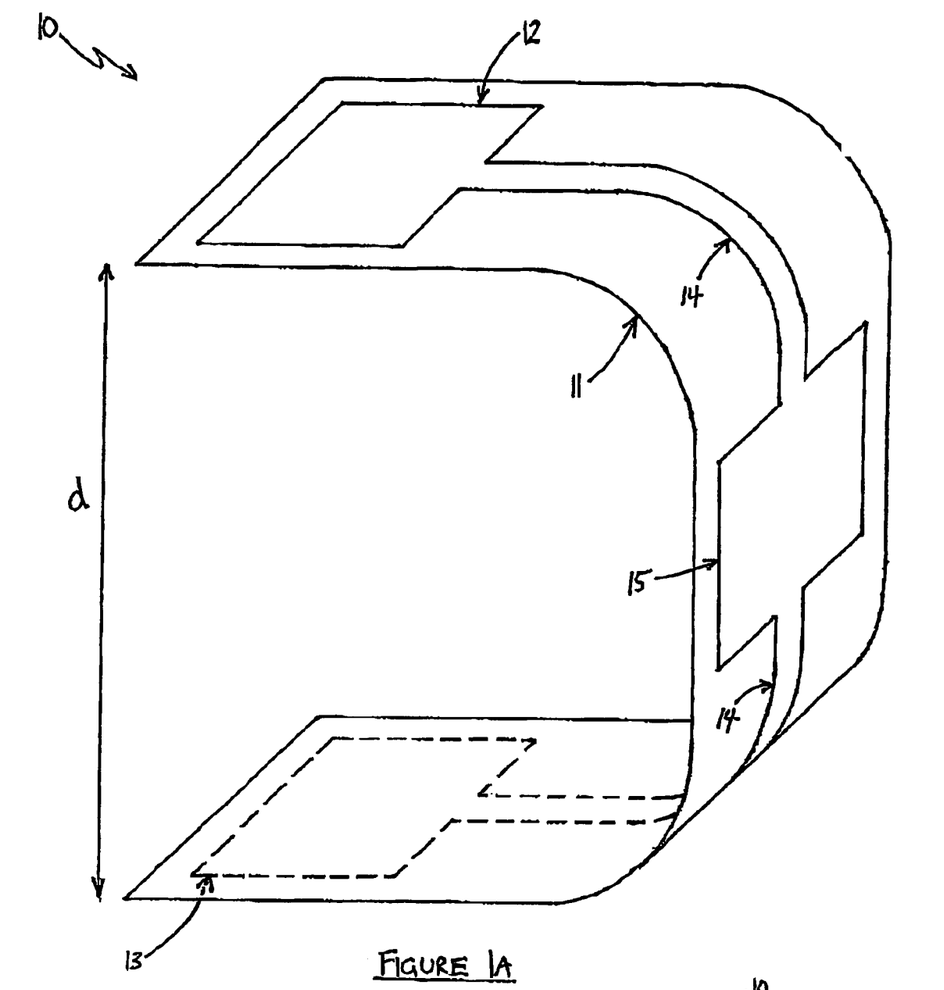
FIG. 1 illustrates a HTS gradiometer in accordance with a first embodiment of the present invention.

FIG. 1 illustrates a high temperature superconducting (HTS) axial gradiometer 10 in accordance with an embodiment of both the first and fifth aspects of the present invention. The axial gradiometer comprises a flexible Hastelloy tape 11, providing a substrate for superconducting elements of the gradiometer. A buffer layer of YSZ has been grown over a surface of the Hastelloy tape to enhance biaxial alignment of YBCO formed over the YSZ. A first pick-up loop 12 formed of YBCO is provided proximal to one end of the tape 11, and a second pick-up loop 13 also formed of YBCO is provided proximal to an opposite end of the tape 11. The pick-up loops are connected to each other via strip-line connectors 14 and flux transformer 15 in a manner which substantially cancels out common-mode magnetic fields such as the earth's magnetic field, such that only a magnetic field which has a gradient between the first and second pick-up loops will cause current to flow in the superconducting YBCO elements 11, 12, 13, 14, 15.

Figure 1B:
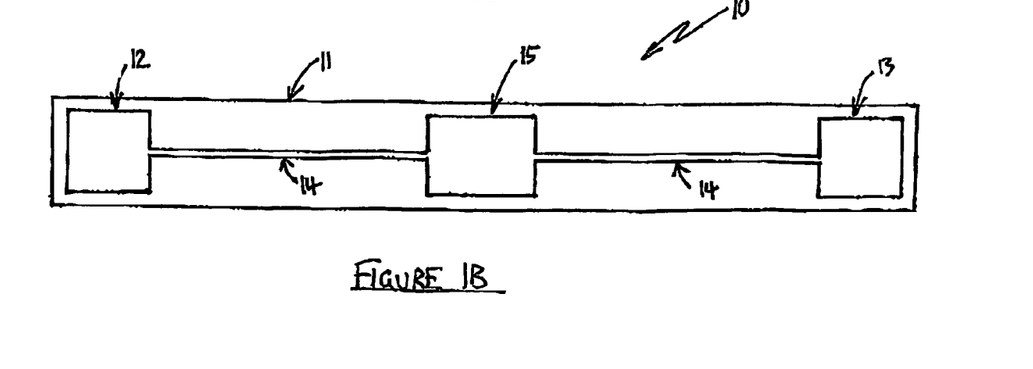

As can be seen, all superconducting elements of the gradiometer 10 can be fabricated on a single surface of the tape 11, and can be formed while positioned in a single plane using planar deposition technologies, see FIG. 1b. Further, due to the flexibility of the Hastelloy tape, once fabricated the first and second pick-up loops 12, 13 can be axially aligned and positioned in substantially parallel planes a distance d apart.

A SQUID, not shown, may then be "sandwich mounted" to the Hastelloy tape 11 so as to be in close proximity to the flux transformer 15 and to maximise magnetic coupling between the SQUID and the flux transformer 15. Thus, when current is induced in the flux transformer 15 by a magnetic field having a gradient between the first and second pick up loops 12, 13, the current circulating in the flux transformer 15 will induce another magnetic field, which will be coupled to the SQUID for detection, By using only a single SQUID, the present invention enables a HTS gradiometer to be constructed which does not suffer from the deficiencies associated with measurements relying on the measurements obtained by two different SQUIDs having differing inherent characteristics. Further, by using a flexible Hastelloy tape or the like, the present invention enables a single SQUID HTS gradiometer to be constructed, as flexible HTS circuits may be formed on such a substrate.

Figure 2:
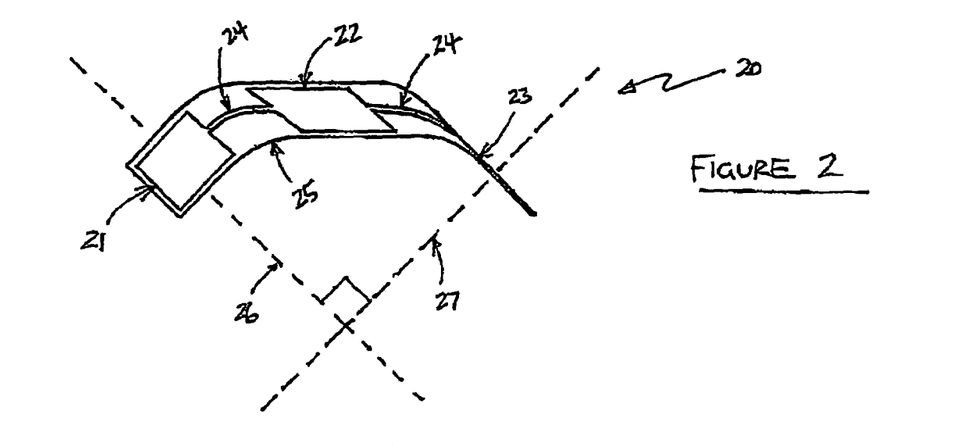
FIG. 2 illustrates a magnetic field detection element in accordance with a second embodiment of the present invention.

FIG. 2 illustrates a magnetic field detection element 20, in accordance with an embodiment of the first aspect of the present invention. The magnetic field detection element 20 comprises a first pick up loop 21, a flux transformer 22, and a second pick up loop 23 not visible but of equal dimensions as pick up loop 21. The pick-up loops 21 and 23 and the flux transformer 22 are formed on a flexible substrate comprising a Ceraflex tape 25. A buffer layer of YSZ (not shown) is formed over the tape 25, and the pick-up loops 21, 23 and the flux transformer 22 are formed of YBCO deposited over the buffer layer. Tracks 24 connect pick-up loops 21, 23 with flux transformer 22.

In accordance with the present invention, the flexible substrate 25 is arranged such that the pick-up loop 21 is positioned in a first plane which is substantially perpendicular to a second plan in which the second pick-up loop 23 is positioned. As indicated at 26, 27, the normals to the planes in which the pick-up loops 21, 23 are positioned meet at substantially 90 degrees.

Accordingly, when a magnetic dipole is positioned with random orientation where the normals 26, 27 meet, the magnetic detection element 20 is more likely to detect the magnetic dipole than prior art arrangements in which a pick-up loop is provided in one plane only. For example, if the magnetic dipole is aligned along axis 27, the field of the dipole will couple strongly through pick-up loop 23, but will not couple strongly into pick-up loop 21. If the magnetic dipole is aligned along axis 26, the field of the dipole will couple strongly into pick-up loop 21, but will not couple strongly into pick-up loop 23. If the dipole is aligned at 45 degrees to each axis 26, 27, the field of the dipole will couple with equal strength into each pick-up loop.

When a field couples into one or both of pick-up loops 21, 23, current will be induced. This current will be passed to flux transformer 22, which is preferably designed so as to maximise magnetic coupling to a SQUID (not shown) which is to be sandwich mounted onto the tape 25. Detection of the magnetic field of the dipole can then be carried out with high sensitivity by the SQUID.

Figure 3:
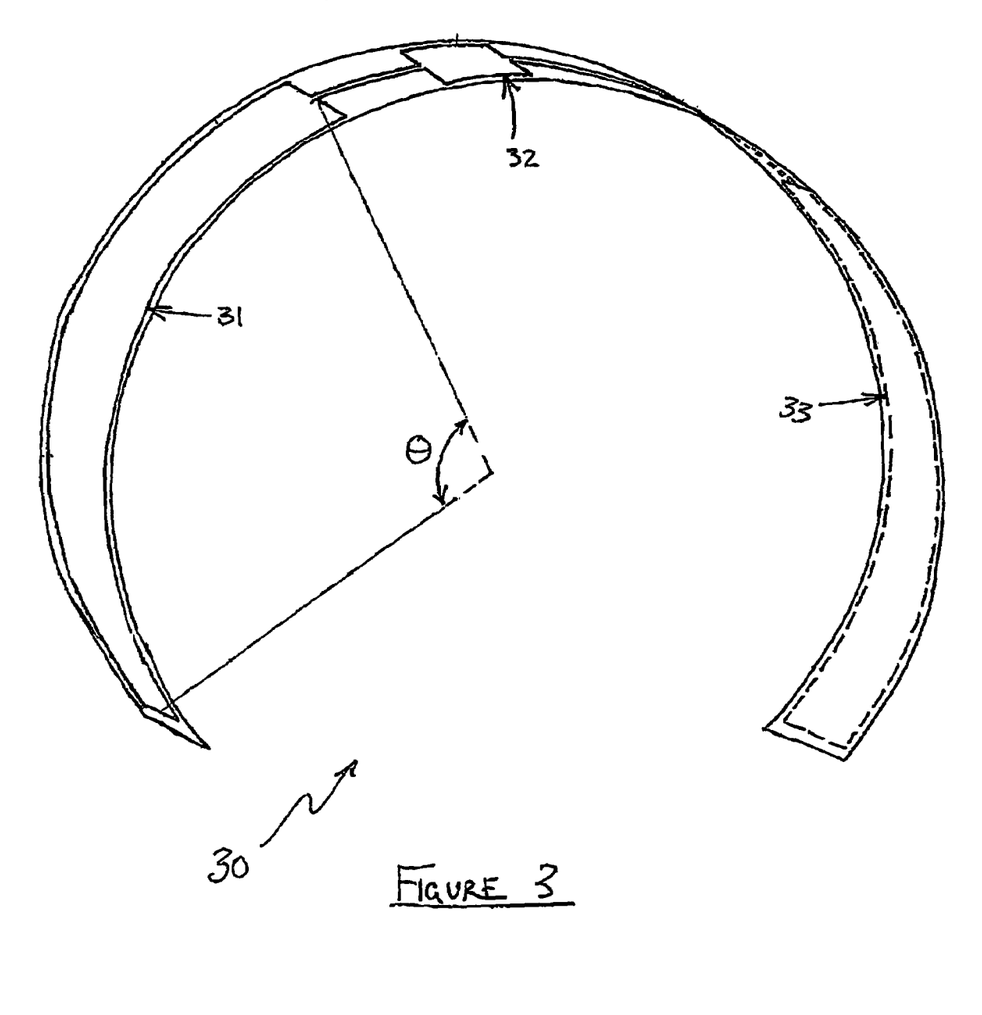
FIG. 3 illustrates a magnetic field detection element in accordance with a third embodiment of the present invention.

FIG. 3 illustrates a magnetic field detection element 30 in accordance with another embodiment of the first aspect of the present invention. The element 30 comprises a first pick-up loop 31, a flux transformer 32 and a second pick-up loop 33. Pick-up loop 31 subtends an angle θ of greater than 90 degrees. Consequently, a magnetic dipole aligned along an axis anywhere within angle θ, will couple relatively strongly through pick-up loop 31. Similarly, a magnetic dipole with an axis which is aligned anywhere within the angle (not shown) subtended by pick-up loop 33 will couple relatively strongly through pick-up loop 33. A stronger coupling will induce greater current in the pick-up loops 31, 33, and thus provide a stronger signal for detection by a SQUID sandwich mounted over flux transformer 32.

Figure 4A:
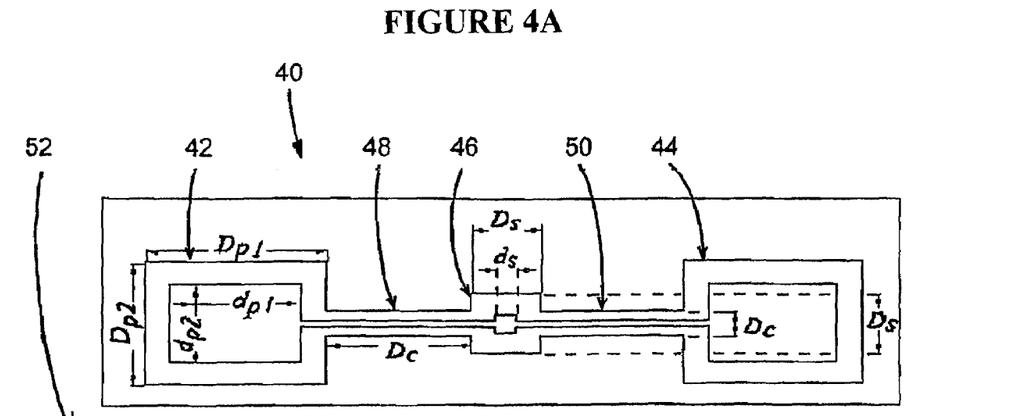
FIGS. 4(a) to 4(d) illustrate an HTS gradiometer in accordance with a fourth embodiment of the present invention.
Figure 4B:
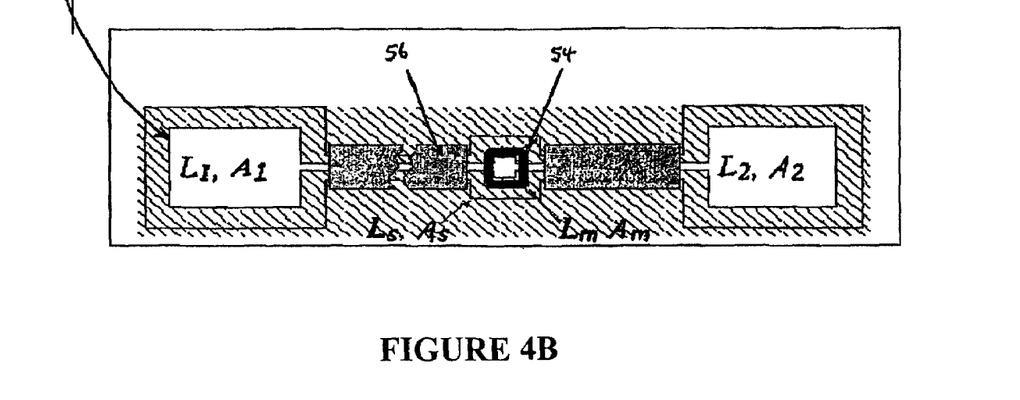
Figure 4C:
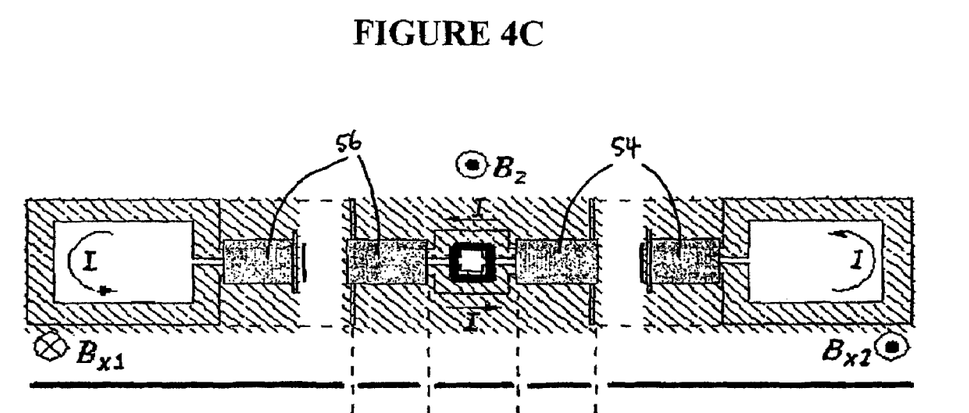
Figure 4D:
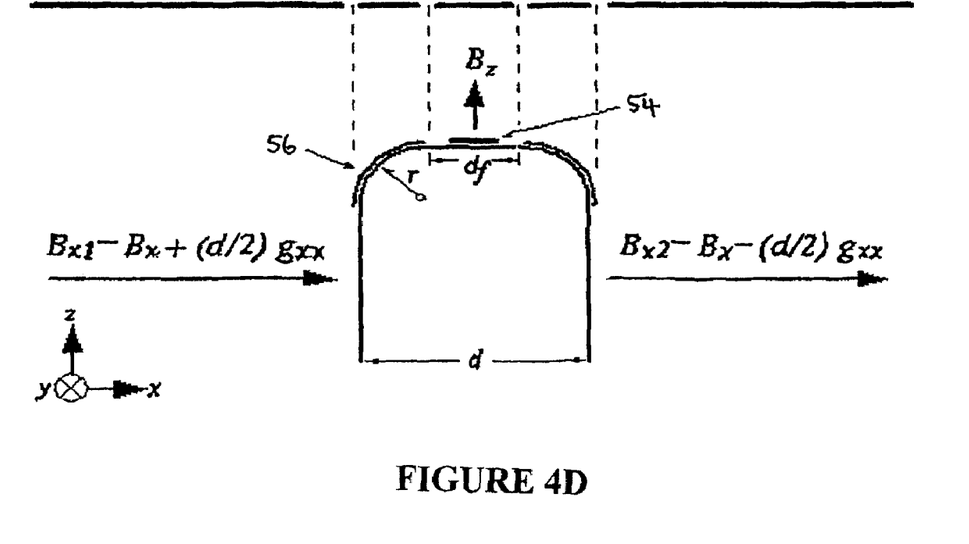

According to a further embodiment there is shown in FIGS. 4(a) to 4(c) an HTS gradiometer 40. FIG. 4(a) shows a first pick-up loop 42, a second pick-up loop 44 and a flux transformer 46. Each of the pick-up loops 42, 44 are directly linked to a secondary loop of the flux transformer 46 via respective strip conductors/connectors 48 and 50. Each of the pick-up loops 42, 44 and the secondary loop of the flux transformer 46 may each be formed of YBCO material. They are each fabricated on a flexible Hastelloy tape 52, shown in FIGS. 4(b) and 4(c) as shading. FIG. 4(b shows the gradiometer 40 assembled prior to bending the strip conductor sections 48 and 50. FIG. 4(c) shows a plan and side view of the complete axial gradiometer. A superconducting ground plane 56 covers each of the strip conductors 48 and 50. In the side view of the gradiometer in FIG. 4(c), the ground planes 56 and strip conductors 48, 50 are shown curved with a radius r.

The first pick-up loop 42 has internal dimensions $d_{p1}$, $d_{p2}$ and external dimensions $D_{p1}$, $D_{p2}$. The second pick-up loop 44 has similar dimensions to that of the first pick-up loop 42 and the secondary loop of the flux transformer 46 has an internal length $d_S$ and external length $D_S$. A SQUID may be sandwich mounted to the Hastelloy tape 52 of which a pick-up loop 54 is shown which is in close proximity to the secondary loop of the flux transformer 46 to establish a magnetic coupling therebetween. The magnetometer pick-up loop 54 has inductance $L_M$ and area $A_M$, the secondary loop of the flux transformer has inductance $L_S$ and effective area $A_S$. Each of the pick-up loops 42 and 44 respectively have inductance $L_1$, $L_2$ and equivalent areas $A_1$ and $A_2$ respectively.

Shown in FIG. 4(c) is the gradiometer having each of the pick-up loops 42 and 44 in parallel planes separated by distance d with the stripline connectors 48, 50 bent with a radial curvature r. Magnetic field $B_Z$ is shown normal to the SQUID and flux transformer 46 whilst the magnetic field impinging on the first pick-up loop 42 is $B_{X1} - B_X + (d/2)g_{XX}$ and the field impinging on the second pick-up loop 44 is $B_{X2} - B_X - (d/2)g_{XX}$. Thus when current is induced in the secondary loop of the flux transformer 46 by magnetic field having a gradient between the first and second pick-up loops 42, 44, the current circulating in the secondary loop induces a further magnetic field which couples with the pick-up loop 54 of the SQUID thereby inducing a further current which is detected by the SQUID.

With regard to the design of the axial gradiometer, the strip-line sections are folded to form a "U" shape with the primary pick-up loops aligned on a common axis that is then perpendicular to the axis of the SQUID. Since the SQUID is oriented perpendicularly to the gradient pick-up loops, and assuming the orientation, this device is sensitive to both the first-order axial gradient, $\partial B_x/\partial x$, and to the transverse component of the magnetic field $B_z$. For applications in which the sensitivity to $B_z$ must be reduced, this can be achieved by appropriate design of the secondary loop and SQUID to ensure shielding of the magnetometer by currents induced in the secondary pick-up loop. The pick-up loop structure so formed is a series type. This decreases the magnitude of the shielding current which results from the components of any external homogeneous magnetic fields in the plane normal to the SQUID axis. Currents in the pick-up loops are induced only by a field gradient in the x-direction, mismatches between the magnetic equivalent areas of the primary loops, direct exposure of the strip-lines to the external field or by incorrect mutual inductance between the secondary loop and the SQUID.

The axial gradiometer may also be mounted such that it is possible to rotate the gradiometer device either the SQUID and pick up loop together or the pick up loop with the SQUID stationary to achieve further improvements to the device usefulness. These improvements are:

true value of the gradient field and magnetic field,
greatly enhanced common mode rejection of homogeneous fields
real time information of the condition of the SQUID operation
if three axial gradiometers are mounted near orthogonally or orthogonally, jointly they provide all five unique components of the first order gradient tensor and the three components of the total field these improvements can be achieved without the need to attain perfect balance usually achieved by the physical alignment of the pick up loops of the flexible tape.

Rotation of axial gradiometers of both HTS axial gradiometers described here and LTS axial gradiometers provides the above enhancements.

Theory of Operation.

Assume a lumped inductance model with all mutual inductances regarded as negligible other than the mutual inductance, M, between the secondary loop of the flux transformer and the magnetometer. In what follows it is assumed that the magnetometer employed is a SQUID based directly-coupled magnetometer. In this type of magnetometer a superconducting pick-up loop is used to sense the external magnetic field. The inductance and equivalent area of the magnetometer pick-up loop will be denoted $L_m$ and $A_m$ respectively. Currents induced in this loop are injected into a SQUID amplifier that has a geometry optimized for minimum flux noise. A magnetometer of this type is assumed for two reasons. Firstly these devices currently provide the best sensitivity possible from HTSC SQUID based magnetometers, and are therefore likely candidates for a practical device. Secondarily, as will be seen below, the alternative choice of a DC or RF SQUID with a flux-focussing washer, can be regarded as a special case of the present theory.

Since the magnetometer is coupled to the transformer secondary by a short-circuit superconducting loop, the flux in this loop is conserved with respect to changes in the external field. The total flux in the magnetometer pick-up loop is the sum of the fluxes due to the external field, its own shielding current and the flux coupled via the mutual inductance M from the current I, in the secondary loop of the transformer. Assuming, without loss of generality, that the device is zero field cooled (Z.F.C), this sum vanishes, i.e, $$B_z A_m - I_m L_m - MI = 0$$

The flux transformer is also a shorted superconducting loop, so once again assuming it is Z.F.C $$B_{x2}A_2 - B_{x1}A_1 - IL + B_z A_s - I_m M = 0$$

where L is the total inductance of the transformer, i.e.:

$$L = L_1 + L_2 + 2L_c + L_s.$$

$L_k$, $A_k$ denote the inductance and equivalent area of the primary loop k, (k=1,2), $L_c$ in the inductance of each of the strip-lines and $L_s$ is the inductance of the secondary loop.

Solving equations and simultaneously gives for the magnetometer current $$I_m = \frac{dMAg_{xx} - B_z[A_m L - MA_s]}{M^2 - L_m L}$$

where $A_1 = A_2 \triangleq A$, and $$B_{x2} - B_{x1} = \left(B_x + \frac{d}{2}g_{xx}\right) - \left(B_x - \frac{d}{2}g_{xx}\right) = dg_{xx}$$

This can be re-written in terms of the coupling constant α by use of the standard relation $$M = \alpha\sqrt{L_m L_s}$$

to yield $$I_m = \frac{B_z\left(A_m\frac{L}{L_m} - \alpha A_s\sqrt{\frac{L_s}{L_m}}\right) - \alpha dA g_{xx}\sqrt{\frac{L_s}{L_m}}}{2(L_p + L_c) + L_s(1-\alpha^2)}$$

where $L_1 = L_2 \triangleq L_p$.

Condition for Shielding to Suppress Sensitivity to $B_z$.:

If the external field is homogeneous $g_{xx}=0$ and equation becomes $$I_m = B_z\frac{A_m\frac{L}{L_m} - \alpha A_s\sqrt{\frac{L_s}{L_m}}}{2(L_p + L_c) + L_s(1-\alpha^2)}$$

which vanishes if $$\frac{A_m}{A_s} = \frac{\alpha\sqrt{L_m L_s}}{2L_p + 2L_c + L_s} = \frac{M}{L}$$

Optimization and gradient sensitivity.

If is fulfilled, equations and for the magnetometer current, become simply $$I_m = -dAg_{xx}\frac{M}{L_m L - M^2} \quad (1)$$

$$= -dAg_{xx}\frac{\alpha\sqrt{\frac{L_s}{L_m}}}{2(L_p + L_c) + L_s(1-\alpha^2)}$$

To study the behaviour of equation (1), note that in general both A, the equivalent area of the primary loops of the transformer, and $L_p$ depend upon the dimensions of the primary loop. As far as the applicant is aware exact forms for these relations do not exist for either square or rectangular superconducting structures and it is usual to resort to empirical formulae which are motivated either by experiment or numerical simulation. The following empirical relations will be used in which $d_p \triangleq (d_1+d_2)/2$ and $D_p \triangleq (D_1+D_2)/2$ $$A = \gamma_p d_p D_p \quad (2)$$

where $0.8 \lesssim \gamma_p \lesssim 1$ is approximately constant, $$L_p = \mu_0 d_p(e^{-\pi(D_p - d_p)/2d_p} + 1.2)$$

provided that $(D_p - d_p)/2d_p \gtrsim 0.1 \Rightarrow D_p > 1.2d_p$.

Equation (2) above is the widely accepted form for the equivalent area of a square washer[Ketchen1] in which the average values of the inner and outer dimensions of the rectangular loop are used.

Use of these relations in equation (1) above gives $$\frac{I_m}{dg_{xx}} =$$

-continued $$\gamma_p \alpha d_p D_p \frac{\sqrt{L_s}}{\sqrt{L_m}} \times [2L_c + L_s(1-\alpha^2) + 2\mu_0 d_p (e^{-\pi(D_p-d_p)/2d_p} + 1.2)]^{-1}$$

Figure 5:
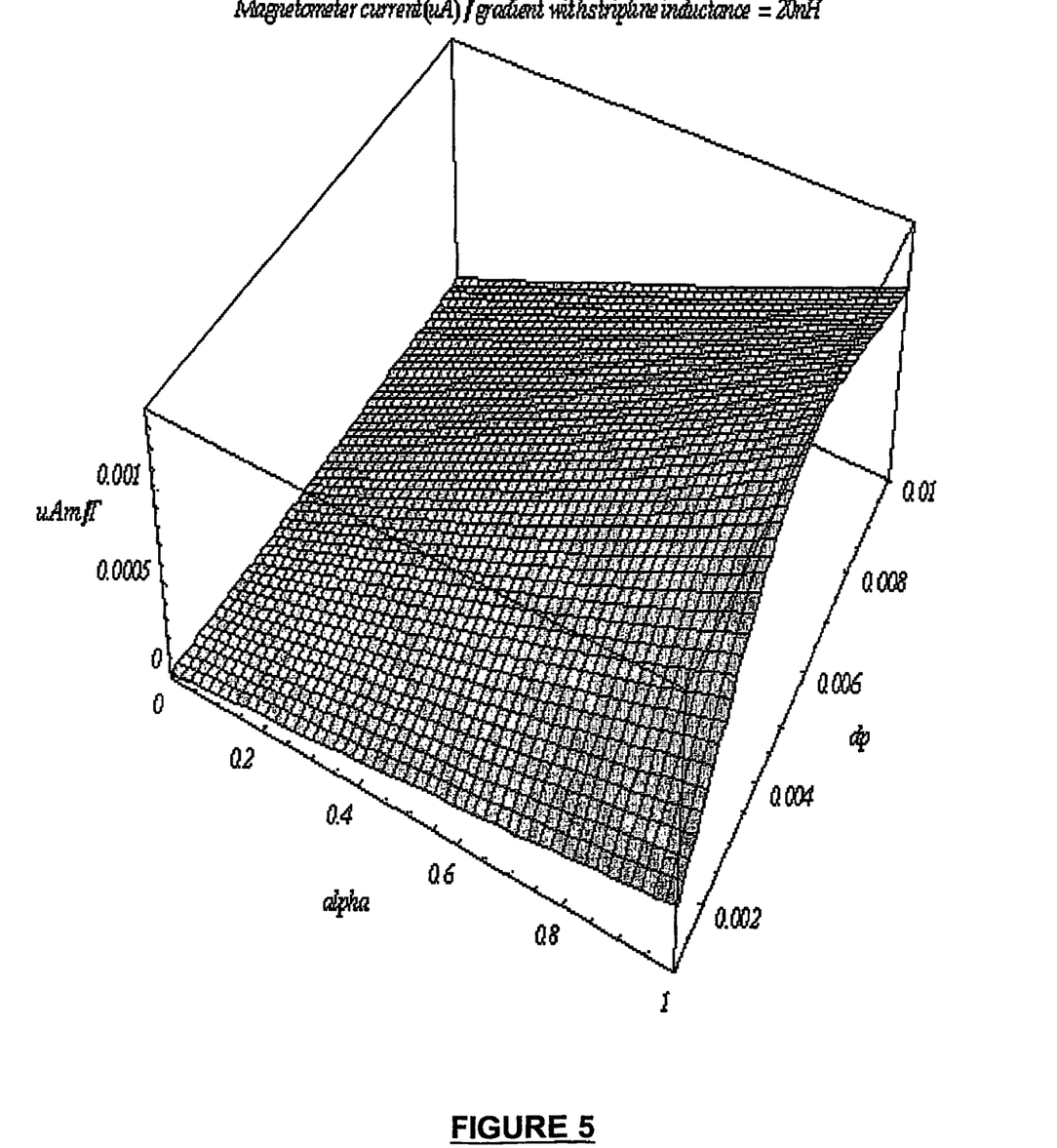
FIG. 5 illustrates the variation of the magnetometer current and gradient sensitivity with a stripline inductance of 20 nH.
Figure 6:
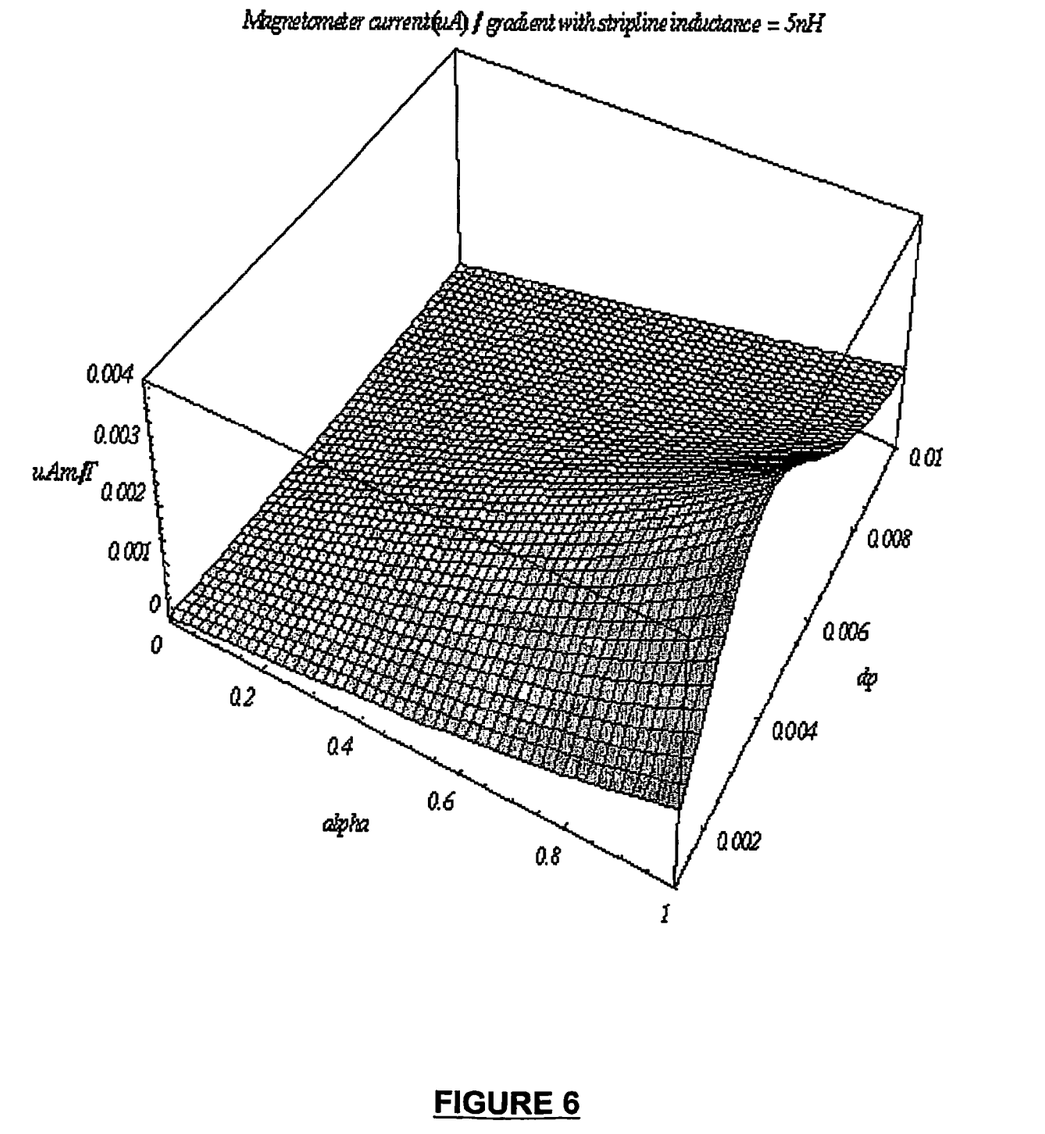
FIG. 6 illustrates the variation of the magnetometer current and gradient sensitivity with a stripline inductance of 5 nH and FIG. 7 illustrates the variation of the magnetometer current and gradient sensitivity with a stripline inductance of 0.5 nH.
Figure 7:
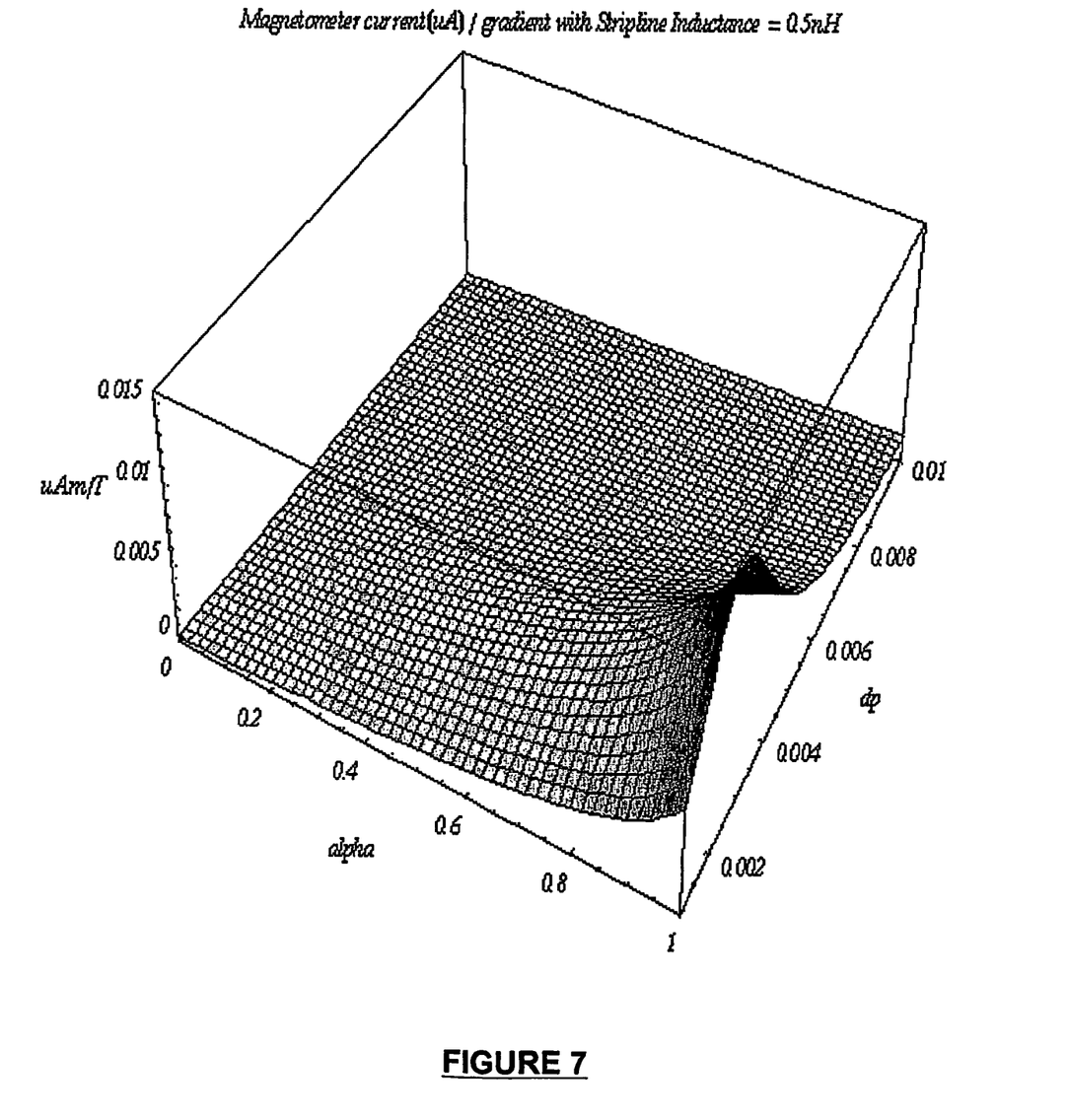

Shown in FIGS. 5, 6, 7 are plots plotted as a function of $d_p$ and $\alpha$ for three different values of $L_c$, namely 20 nH, 5 nH and 0.5 nH respectively. Other parameters are set as follows: $D_p$=0.01, $\gamma_p$=0.9, $L_m$=5 nH, $L_s$=10 nH.

It will be appreciated by persons skilled in the art that numerous variations and/or modifications may be made to the invention as shown in the specific embodiments without departing from the spirit or scope of the invention as broadly described. For example, a device similar to that shown in FIG. 3 may comprise a single pick-up loop only, subtending an arc in order to increase a range of magnetic dipole orientations which can be detected by the pick-up loop. Further, such devices may comprise a SQUID fabricated on the tape itself in place of the flux transformer, such that the current of the pick-up loops flows directly into the SQUID for detection. Furthermore, the present invention may be applied in conjunction with the invention set out in the co-pending PCT application claiming priority from Australian Provisional Patent Application No. 2002950624 and filed simultaneously with the present application, the contents of which are included herein by reference. The present embodiments are, therefore, to be considered in all respects as illustrative and not restrictive.

The invention claimed is:

1. A superconducting magnetic field detection element comprising at least one superconducting pick-up loop formed on a common flexible substrate, wherein the common flexible substrate is in a non-planar position, such that the at least one superconducting pick-up loop is operable to detect magnetic fields of differing orientation, and further comprising a flux transformer configured for inductive coupling of detected signals to a superconducting quantum interference device (SQUID).

2. A superconducting magnetic field detection element according to claim 1 wherein the common flexible substrate partially extends within a first plane and partially extend within a second plane substantially perpendicular to the first plane such that the at least one superconducting pick up loop is positioned in both the first plane and the second plane.

3. A superconducting magnetic field detection element according to claim 1 wherein the common flexible substrate is positioned such that the at least one superconducting pick-up loop describes an arc subtending a predetermined angle about a nominal focus.

4. A superconducting magnetic field detection element according to claim 1, comprising a plurality of pick-up loops, and wherein the common flexible substrate is arranged so as to position each of the plurality of pick up loops in a unique plane which is not coplanar with any plane in which another pick up loop is positioned.

5. A superconducting magnetic field detection element according to claim 4 comprising a first superconducting pick-up loop positioned in a first plane and a second superconducting pick-up loop positioned in a second plane substantially perpendicular to the first plane.

6. A superconducting magnetic field detection element according to claim 4 comprising a first superconducting pick-up loop positioned in a first plane and a second superconducting pick-up loop positioned in a second plane substantially parallel to and spaced apart from the first plane.

7. A superconducting magnetic field detection element according to claim 4 comprising a first superconducting pick-up loop positioned in a first plane and a second superconducting pick-up loop positioned in a second plane such that the first superconducting pick-up loop and the second superconducting pick-up loop describe an arc along the common flexible substrate that subtends a predetermined angle about a nominal focus.

8. A superconducting magnetic field detection element according to claim 1 wherein the common flexible substrate is selected from Hastelloy tape and a partially or fully stabilized zirconia substrate, such as Ceraflex.

9. A superconducting magnetic field detection element according to claim 1 further comprising a superconducting quantum interference device (SQUID) for detecting current induced in the at least one pick-up loop as a result of a magnetic field passing through the at least one pick-up loop, wherein the SQUID is inductively coupled to the at least one pick-up loop through the flux transformer formed on the common flexible substrate.

10. A superconducting magnetic field detection element according to claim 9 wherein the SQUID is magnetically coupled to the at least one or multiple pick-up loops through a flux transformer formed on the common flexible substrate.

11. A superconducting magnetic field detection element according to claim 1 wherein a minimum radius of curvature or twist of the common flexible substrate is controlled in order to avoid damage to the element.

12. A superconducting magnetic field detection element according to claim 5 wherein the common flexible substrate is twisted in order to provide circuit elements, such as a superconducting pick-up loop, in a third plane.

13. A method of forming an element of a superconducting device for detecting magnetic fields, the method comprising:
    forming at least one high temperature superconducting pick-up loop on a common flexible substrate, and forming a flux transformer on the common flexible substrate for inductive coupling of detected signals to a superconducting quantum interference device (SQUID; and
    positioning the common flexible substrate in a non-planar configuration such that the at least one superconducting pick-up loop is operable to detect magnetic fields of differing orientation.

14. A method according to claim 13 further comprising partially extending the common flexible substrate within a first plane and partially extending the common flexible substrate within a second plane substantially perpendicular to the first plane such that the at least one superconducting pick up loop is positioned in both the first plane and the second plane.

15. A method according to claim 13 further comprising positioning the common flexible substrate such that the at least one superconducting pick-up loop describes an arc subtending a predetermined angle about a nominal focus.

16. A method according to claim 13, wherein a plurality of superconducting pick-up loops are formed on the common flexible substrate, and further comprising arranging the common flexible substrate so as to position each of the plurality of pick up loops in a unique plane which is not coplanar with any plane in which another pick up loop is positioned.

17. A method according to claim 16 further comprising positioning a first superconducting pick-up loop in a first plane and positioning a second superconducting pick-up loop in a second plane substantially perpendicular to the first plane.

18. A method according to claim 16 further comprising positioning a first superconducting pick-up loop in a first plane and positioning a second superconducting pick-up loop in a second plane substantially parallel to and spaced apart from the first plane.

19. A method according to claim 16 further comprising positioning a first superconducting pick-up loop in a first plane and positioning a second superconducting pick-up loop in a second plane such that the first superconducting pick-up loop and the second superconducting pick-up loop describe an arc along the common flexible substrate that subtends a predetermined angle about a nominal focus.

20. A method according to claim 13 further comprising the step of detecting current induced in the at least one or multiple pick-up loops as a result of a magnetic field passing through the at least one or multiple pick-up loops.

21. A superconducting gradiometer comprising:
 a first high temperature superconducting pick-up loop defining and substantially residing in a first nominal plane; and
 a second high temperature superconducting pick-up loop defining and substantially residing in a second nominal plane; and a flux transformer configured to inductively couple detected signals to a superconducting quantum interference device (SQUID);
 wherein the first pick-up loop and the second pick-up loop are formed on a common flexible substrate, wherein the first nominal plane and the second nominal plane are substantially parallel, and wherein the first nominal plane and the second nominal plane are sufficiently spaced apart to allow the first pick-up loop and the second pick-up loop to act to distinguish local magnetic fields from background magnetic fields.

22. A superconducting gradiometer according to claim 21 that is axial.

23. A superconducting gradiometer according to claim 22 further comprising a flux transformer inductively coupled to the SQUID for detecting current induced in either the first or second pick-up loops as a result of a magnetic field passing through the first or second pick-up loops.

24. A superconducting gradiometer according to claim 22 further comprising a flexible strip-line conductor connecting each of the first and second pick-up loops to a flux transformer.

25. A superconducting gradiometer according to claim 24 wherein an additional length of flexible superconducting tape covers each of the strip-line conductors forming a ground plane.

\* \* \* \* \*